United States Patent
Bischof et al.

(10) Patent No.: US 12,117,504 B2
(45) Date of Patent: Oct. 15, 2024

(54) METHOD AND APPARATUS FOR DETERMINING A STATE OF CAPACITIVE VOLTAGE TRANSFORMER

(71) Applicant: OMICRON electronics GmbH, Klaus (AT)

(72) Inventors: Thomas Bischof, Rankweil (AT); David Gopp, Dornbirn (AT)

(73) Assignee: OMICRON electronics GmbH, Klaus (AT)

( * ) Notice: Subject to any disclaimer, the term of this patent is extended or adjusted under 35 U.S.C. 154(b) by 154 days.

(21) Appl. No.: 18/015,899

(22) PCT Filed: Jul. 5, 2021

(86) PCT No.: PCT/EP2021/068482
§ 371 (c)(1),
(2) Date: Jan. 12, 2023

(87) PCT Pub. No.: WO2022/012989
PCT Pub. Date: Jan. 20, 2022

(65) Prior Publication Data
US 2023/0305079 A1    Sep. 28, 2023

(30) Foreign Application Priority Data

Jul. 13, 2020 (AT) .............. A 50607/2020

(51) Int. Cl.
*G01R 15/06* (2006.01)
*G01R 27/02* (2006.01)
*G01R 31/62* (2020.01)

(52) U.S. Cl.
CPC ............. *G01R 31/62* (2020.01); *G01R 27/02* (2013.01)

(58) Field of Classification Search
CPC ............... G01R 27/02; G01R 27/2605; G01R 27/2611; G01R 15/06; G01R 31/50; G01R 31/62
See application file for complete search history.

(56) References Cited

U.S. PATENT DOCUMENTS

| | | |
|---|---|---|
| 2,454,265 A | 11/1948 | Jaynes |
| 2,843,828 A | 7/1958 | Bussard et al. |

(Continued)

FOREIGN PATENT DOCUMENTS

| | | |
|---|---|---|
| AU | 616250 B2 | 10/1991 |
| CN | 103364604 A | 10/2013 |

(Continued)

OTHER PUBLICATIONS

Office Action dated Oct. 17, 2023 from related/corresponding Australian Patent Application No. 2021307068.

(Continued)

*Primary Examiner* — Thang X Le
(74) *Attorney, Agent, or Firm* — KUSNER & JAFFE

(57) ABSTRACT

The present invention relates to a method for determining a state of a capacitive voltage transformer which, on its primary side, comprises a capacitive voltage divider having a first capacitor and a second capacitor. The first capacitor has a high-voltage connection for connection to a high voltage and the second capacitor has a ground connection. A first resonant frequency is determined by way of a plurality of first short-circuit impedance measurements at different frequencies on a secondary side of the capacitive voltage transformer while the high-voltage connection is connected to earth. A second resonant frequency is determined by way (Continued)

of a plurality of second short-circuit impedance measurements at different frequencies on the secondary side of the capacitive voltage transformer while the high-voltage connection is open. A capacitance ratio of the capacitive voltage divider is determined on the basis of the first resonant frequency and the second resonant frequency.

17 Claims, 9 Drawing Sheets

(56) References Cited

U.S. PATENT DOCUMENTS

| | | | | |
|---|---|---|---|---|
| 3,870,927 | A * | 3/1975 | Hughes | H02H 7/05 |
| | | | | 324/126 |
| 9,817,053 | B2 | 11/2017 | Kruger et al. | |
| 2003/0164714 | A1* | 9/2003 | Ghassemi | G01R 15/06 |
| | | | | 324/658 |
| 2015/0212121 | A1 | 7/2015 | Matsumoto et al. | |
| 2019/0094287 | A1* | 3/2019 | Schweitzer, III | G01R 15/06 |
| 2022/0043070 | A1* | 2/2022 | Mallett | G01R 15/16 |

FOREIGN PATENT DOCUMENTS

| | | |
|---|---|---|
| CN | 108427058 A | 8/2018 |
| EP | 0043761 B1 | 8/1984 |
| EP | 1295133 B1 | 7/2004 |
| RU | 2248002 C2 | 3/2005 |
| RU | 2633155 C2 | 10/2017 |

OTHER PUBLICATIONS

International Search Report from corresponding International Patent Application No. PCT/EP21//68482, dated Nov. 12, 2021.
Gopp David: "Einflussgrößen bei der modellbasierten Prüfung von kapazitiven pannungswandlern—Was sind die einflussreichsten Parameter der modellbasierten Prüfung von kapazitiven Spannungswandlern und wie wirken sich diese auf den Übersetzungsund Phasenfehler aus?" (with English-language abstract) Fachhochschule Vorarlberg, Aug. 1, 2019, pp. 1-104.
Predl, et al., "Diagnosemessungen an Messwandlern: Eine Übersicht und Zuordnung von Diagnosemessungen", OMICRON electronics GmbH, Dec. 12, 2022, pp. 1-21.
Search Report from related/corresponding Russian Patent Appl. No. 2023102946, dated Jun. 28, 2023.

* cited by examiner

METHOD AND APPARATUS FOR DETERMINING A STATE OF CAPACITIVE VOLTAGE TRANSFORMER

FIELD OF THE INVENTION

The present invention relates to a method for determining a state of a capacitive voltage transformer, in particular for determining defects in a capacitive voltage divider in the capacitive voltage transformer. The present invention further relates to an apparatus for determining a state of a capacitive voltage transformer which implements the method.

BACKGROUND OF THE INVENTION

Voltage transformers are used in the field of electrical power engineering as measuring transformers for measuring alternating voltages. The function of a voltage transformer is to proportionally transfer the high voltage to be measured to low voltage values. Said lower voltage, for example values around 100 V, is transmitted to voltmeters, energy meters and similar devices, for example for measurement or protection purposes. Voltage transformers can be realised as inductive and as capacitive voltage transformers, wherein capacitive voltage transformers can be designed, for example, for primary rated voltages (nominal values) up to more than 1 MV.

Capacitive voltage transformers comprise, on the high-voltage side, a capacitive voltage divider which usually consists of at least two capacitors connected in series. Usually, one end of the series connection of the capacitors is connected to the high voltage to be measured and the other end of the series connection is connected to earth. At a tap between the capacitors, there is a lower voltage proportional to the high voltage to be measured, which can be fed via a transformer, for example, to a voltmeter.

Faults in the capacitive voltage transformer can be caused by defects in the capacitive voltage divider. There are various reasons for defects in the capacitors of the capacitive voltage divider, for example the ingress of moisture into the insulation. Monitoring the development of the change in capacitance over time, so-called "trending", can help to prevent a total failure of the capacitive voltage transformer. A total failure could damage other devices, for example measuring devices connected to the capacitive voltage transformer, and could endanger people. In order to track the temporal development of the change in capacitance and to determine faults in the individual capacitors, the capacitances of the capacitors are measured, for example by way of a Sweep Frequency Response Analysis (SFRA). These measurements are based, for example, on the principle of frequency-dependent short-circuit impedance measurement from the secondary side of the transformer. To this end, the series connection of the capacitors is usually disconnected from the high voltage and from earth. In particular, in order to disconnect the series connection of the capacitors from earth, it must be possible to access the corresponding connection point, which in reality is frequently not the case or is only possible with considerable outlay in installation terms.

SUMMARY OF THE INVENTION

There is a need for an improved method for checking and monitoring capacitors of a capacitive voltage divider in a capacitive voltage transformer.

According to the present invention, a method for determining a state of a capacitive voltage transformer and an apparatus for determining a state of a capacitive voltage transformer are provided, as defined in the independent claims. The dependent claims define embodiments of the invention.

The present invention provides a method for determining a state of a capacitive voltage transformer. The capacitive voltage transformer comprises, on its primary side, a capacitive voltage divider having a first capacitor and a second capacitor. In this context, the primary side of the capacitive voltage transformer refers to the side of the capacitive voltage transformer which is coupled to the high voltage to be measured. The high voltage can, for example, have a voltage of a few 1000V up to a few 100,000V or even 1 MV or more. The secondary side of the capacitive voltage transformer therefore refers to the side of the capacitive voltage transformer which is coupled to the measuring device or another apparatus, for example an energy meter. The first capacitor has a high-voltage connection for connecting the first capacitor to the high voltage. The second capacitor has a ground connection for connecting the second capacitor to earth. In this context, earth can, for example, be a reference potential for the high voltage. Both the first capacitor and the second capacitor can each comprise a plurality of capacitors connected in series in order to increase the voltage-sustaining capability of the resulting capacitor. The first capacitor and the second capacitor can be connected in series, for example, to form the capacitive voltage divider, so that a partial voltage of the high voltage can be tapped at the connection point between the first and second capacitors. The capacitive voltage transformer can further comprise a transformer, to which the voltage is fed on the primary side of the transformer between the connection point and earth and which consequently provides a galvanically separated voltage on the secondary side of the transformer, which voltage is proportional to the voltage tapped between the connection point and earth. The transmission factor of the transformer can, for example, be 1. The transformer can have any other transmission factor, in particular a transmission factor greater than 1, so that the voltage tapped by the voltage divider is transformed down by the transformer.

In the method, a first resonant frequency is determined by way of a plurality of first short-circuit impedance measurements at different frequencies on the secondary side of the capacitive voltage transformer while the high-voltage connection is connected to earth. Furthermore, a second resonant frequency is determined by way of a plurality of second short-circuit impedance measurements at different frequencies on the secondary side of the capacitive voltage transformer while the high-voltage connection is open. A capacitance ratio of the capacitive voltage divider is determined on the basis of the first resonant frequency and the second resonant frequency. The capacitance ratio can, for example, be a ratio of the capacitance of the second capacitor to the capacitance of the first capacitor or a ratio of the second capacitor to the cumulative capacitance of the first and second capacitors. During both the determination of the first resonant frequency and during the determination of the second resonant frequency, the second capacitor can remain connected with its ground connection to earth.

When the capacitances of the capacitors of the capacitive voltage divider change due to wear, for example, the capacitance ratio also changes in general. Therefore, the capacitance ratio can be deemed to be an indicator of a state of the capacitive voltage transformer. Since the capacitance ratio can be determined without disconnecting the ground connection of the second capacitor from earth, the state of the capacitive voltage divider can be quickly and inexpensively determined.

In the method, a measurement current can further be determined on the basis of a burden of the capacitive voltage transformer and a voltage drop at the burden of the capacitive voltage transformer. The plurality of first short-circuit impedance measurements and the plurality of second short-circuit impedance measurements are carried out using the measurement current. The burden of the capacitive voltage transformer relates to the impedance of the secondary circuit of the capacitive voltage transformer and is usually expressed by the apparent power which is taken up under specified conditions. The short-circuit impedance measurements can consequently be carried out specifically with a measurement current, the amplitude of which is close to the nominal current, so that the resonant frequencies can be quickly and reliably established.

In one embodiment, the plurality of first short-circuit impedance measurements comprises a plurality of short-circuit impedance measurements in a first frequency grid followed by a plurality of short-circuit impedance measurements in a second frequency grid. The first frequency grid has a greater frequency distance than the second frequency grid. Alternatively or additionally, the plurality of second short-circuit impedance measurements can comprise a plurality of short-circuit impedance measurements in a first frequency grid followed by a plurality of short-circuit impedance measurements in a second frequency grid. It is also the case here that the first frequency grid has a greater frequency distance than the second frequency grid. In other words, a resonant frequency can be coarsely determined in a first sweep. In the first sweep, frequencies in a wide frequency range can be selected in coarse steps in order to approximately determine the resonant frequency by way of short-circuit impedance measurements. In a second sweep, the resonant frequency can be more accurately determined in that the second sweep is carried out in a frequency range which has been determined by means of the first sweep as the frequency range which comprises the resonant frequency. This frequency range, which has been determined in the first sweep, can be scanned in small steps in the second sweep in order to accurately determine the resonant frequency. Further sweeps can be carried out in order to determine the resonant frequency even more accurately. The first and second resonant frequencies can be determined quickly and reliably by this iterative method.

In the method, a resonant inductance of the capacitive voltage transformer can further be determined on the basis of nominal values of the first and second capacitors and a nominal frequency of the capacitive voltage transformer. The nominal values of the first and second capacitors as well as the nominal frequency of the capacitive voltage transformer can, for example, be inferred from the nameplate of the capacitive voltage transformer. An actual value of the capacitance of the second capacitor can be determined on the basis of the second resonant frequency and the resonant inductance. Since the high-voltage connection is open during the determination of the second resonant frequency, the second resonant frequency substantially only results from the capacitance of the second capacitor. In conjunction with the resonant inductance, the actual value of the capacitance of the second capacitor can therefore be determined from the second resonant frequency, for example using Thomson's formula regarding oscillations.

In further embodiments, as described above, a plurality of actual values of the capacitance of the second capacitor can be determined at different points in time and a temporal trend of the capacitance of the second capacitor can be plotted and/or can be represented on a display apparatus. The temporal trend can be used to extrapolate or estimate whether the state of the capacitive voltage transformer is sufficient for further reliable operation.

On the basis of the actual value of the capacitance of the second capacitor and the capacitance ratio, an actual value of the capacitance of the first capacitor can be determined. At different points in time, a plurality of actual values of the capacitance of the first capacitor can be determined and a temporal trend of the capacitance of the first capacitor can be plotted and/or can be represented on a display apparatus. Consequently, the temporal trend of the first capacitor can also be used to extrapolate or estimate whether the state of the capacitive voltage transformer is sufficient for further reliable operation.

Alternatively or additionally, a plurality of capacitance ratios of the capacitive voltage divider can be determined at different points in time and a temporal trend of the capacitance ratio can be represented on a display apparatus. When a state of the capacitors of the capacitive voltage divider changes, the capacitance ratio of the capacitors with respect to one another also usually changes. A deterioration in the state of the capacitive voltage divider can be simply detected in good time by means of a temporal course of the capacitance ratio.

In a further embodiment, a first dependency of the capacitance ratio on the first resonant frequency is determined. The first dependency can, for example, comprise a partial derivation of the capacitance ratio according to the first resonant frequency. Such a dependency is also referred to as the sensitivity of the capacitance ratio with respect to the first resonant frequency. A plurality of the first dependencies of the capacitance ratio on the first resonant frequency can be determined at a plurality of different points in time and a temporal trend of the first dependency can be represented on a display apparatus.

A second dependency of the capacitance ratio on the second resonant frequency can be further determined. The second dependency can, for example, comprise a partial derivation of the capacitance ratio according to the second resonant frequency. A plurality of the second dependencies of the capacitance ratio on the second resonant frequency can be determined at a plurality of different points in time and a temporal trend of the second dependency can be represented on a display apparatus.

The temporal trend of the first dependency reflects a sensitivity of the total capacitance of the first and second capacitors and the temporal trend of the second dependency reflects a sensitivity of the capacitance of the second capacitor. If there is a change in the first and/or second sensitivity over time, this means that it is possible to infer changes in the state of the first and/or second capacitors by analysing the respective temporal trend of the first or respectively second sensitivity over time.

The present invention further provides an apparatus for determining a state of a capacitive voltage transformer. The capacitive voltage transformer comprises, on its primary side, a capacitive voltage divider having a first capacitor and a second capacitor. The first capacitor has a high-voltage connection for connection to a high voltage. The second capacitor has a ground connection. The first capacitor and the second capacitor can, for example, form a series connection in order to form the capacitive voltage divider. The apparatus comprises a measuring apparatus which is configured to carry out a short-circuit impedance measurement with an adjustable frequency. The apparatus further comprises a control apparatus, for example an electronic control system having a microprocessor which is configured to determine a first resonant frequency by way of a plurality of first short-circuit impedance measurements at different frequencies on a secondary side of the capacitive voltage transformer while the high-voltage connection is connected to earth. The control apparatus is further configured to determine a second resonant frequency by way of a plurality of second short-circuit impedance measurements at different frequencies on the secondary side of the capacitive voltage transformer while the high-voltage connection is open. The control apparatus determines a capacitance ratio of the capacitive voltage divider on the basis of the first resonant frequency and the second resonant frequency.

The apparatus is suitable for carrying out the method described above and the embodiments of the method described above and therefore also comprises the advantages described above.

BRIEF DESCRIPTION OF THE DRAWINGS

The invention is explained in greater detail below with reference to the drawings by means of preferred embodiments. Identical reference numerals refer to identical elements in the drawings.

DETAILED DESCRIPTION OF THE INVENTION

Figure 1:
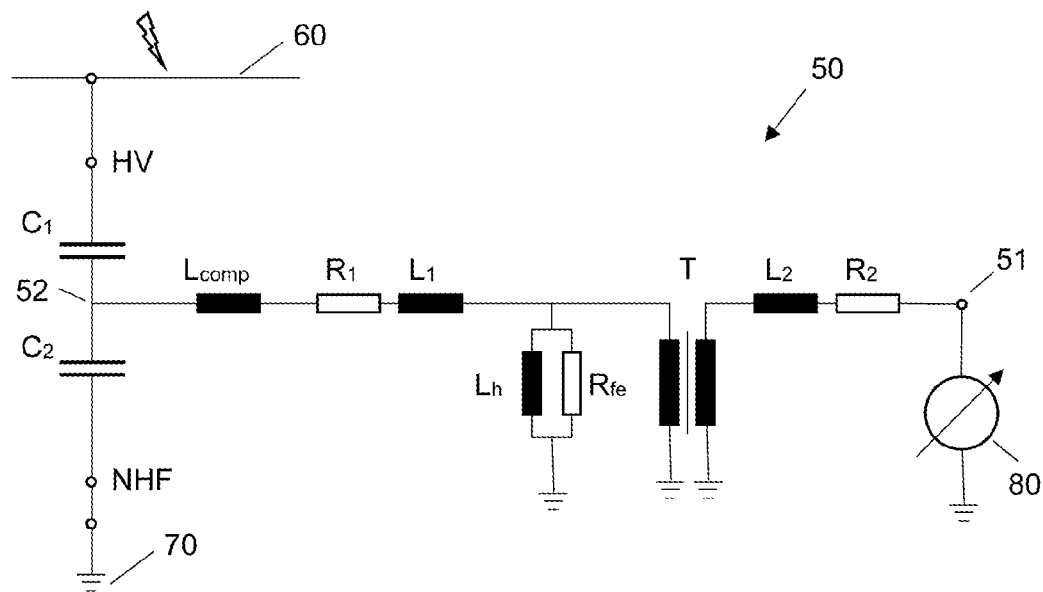
FIG. 1 schematically shows a capacitive voltage transformer in connection with a high-voltage line.

The present invention is explained in more detail below by means of preferred embodiments with reference to the drawings. In the figures, the same reference numerals refer to the same or similar elements. The figures are schematic representations of different embodiments of the invention. Elements represented in the figures are not necessarily drawn to scale. Rather, the different elements represented in the figures are reproduced in such a way that their function and their purpose can be understood by the person skilled in the art.

Connections and couplings between functional units and elements represented in the figures can also be implemented as an indirect connection or coupling. A connection or coupling can be implemented in a wired or wireless manner.

Methods and apparatuses for determining a state of a capacitive voltage transformer are described in detail below. The state of a capacitive voltage transformer can be adversely affected by defects in the capacitors of the capacitive voltage divider. There are various reasons for defects in the capacitors, for example an ingress of moisture into the insulation. To this end, monitoring the change in capacitance over time can help prevent a total failure of the capacitive voltage divider. A total failure can endanger other parts of the installation or people. In order to assess the change in capacitance over time and to localise the defects in the capacitors of the capacitive voltage divider, it can be necessary to establish the capacitances of the capacitors separately from one another.

FIG. 1 schematically shows a capacitive voltage transformer 50 which is coupled via a high-voltage connection HV of the voltage transformer 50 to a high-voltage line 60. The capacitive voltage transformer 50 comprises two series-connected capacitors $C_1$ and $C_2$ which form a voltage divider. The first capacitor $C_1$ is connected to the high-voltage connection HV and the second capacitor $C_2$ is connected via a NHF connection to earth 70. A tap 52 is provided at the connection between the first capacitor $C_1$ and the second capacitor $C_2$, at which tap a partial voltage of the high voltage 60 can be tapped during the operation of the voltage transformer 50. The tapped voltage is conducted via a compensation inductance $L_{comp}$ to a primary winding of a transformer T. A potential-free measurement voltage is available at the secondary winding of the transformer T, which is considerably lower than and proportional to the high voltage on the high-voltage line 60 and can be measured, for example, with a measuring device 80 at a connection 51 on the secondary side of the transformer T. In the schematic representation of FIG. 1, the transformer T is represented as an ideal transformer. The properties of a corresponding real transformer, which are not ideal, are modelled in FIG. 1 by a winding resistance $R_1$ and a leakage inductance $L_1$ on the primary side, a winding resistance $R_2$ and a leakage inductance $L_2$ on the secondary side, a main inductance $L_h$ and core losses $R_{fe}$.

As will be described below with reference to FIGS. 2 to 4, the capacitances of the capacitors $C_1$ and $C_2$ can be distinguished with different Sweep Frequency Response Analysis (SFRA) measurements. Said measurements are based on the principle of frequency-dependent short-circuit impedance measurements on the secondary side of the transformer T. It should be noted that the NHF connection must be disconnected from earth for the measurement according to FIG. 4. However, this is only possible if the NHF connection is accessible and can be disconnected from earth. It can therefore be advantageous to determine the state of the capacitive voltage transformer without the measurement according to FIG. 4. In the case of all of the measurements according to FIGS. 2 to 4, the high-voltage connection HV of the voltage transformer is to be disconnected from the high-voltage line 60.

Figure 2:
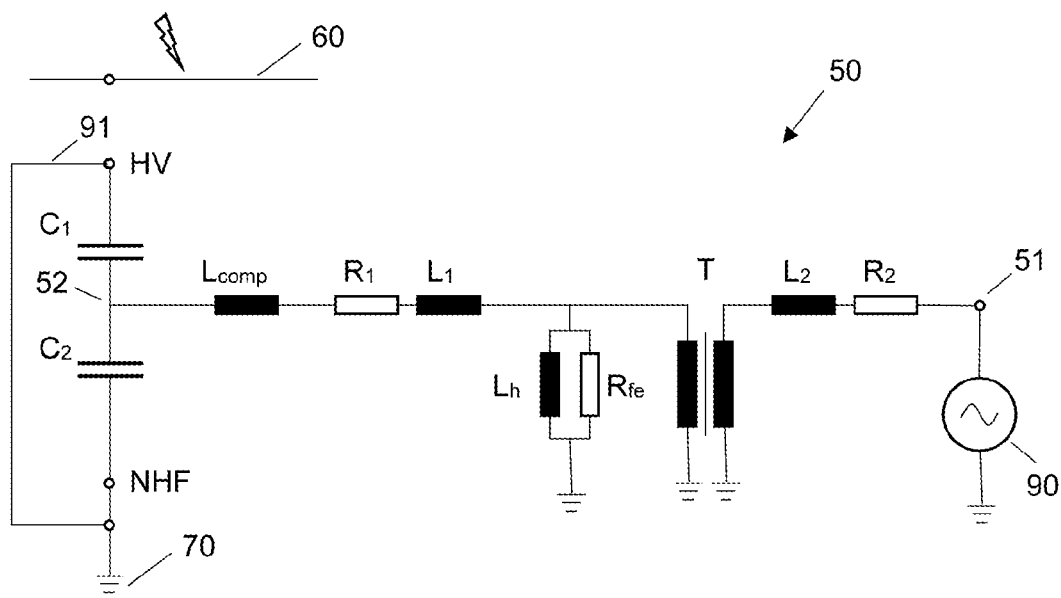
FIG. 2 schematically shows an interconnection of the capacitive voltage transformer of FIG. 1 for determining a first resonant frequency.

In the case of the measurement setup shown in FIG. 2, the high-voltage connection HV is connected via an additional line 91 to earth 70. The NHF connection is likewise connected to earth 70, so that the capacitors $C_1$ and $C_2$ are connected in parallel between the tap 52 and earth 70. A short-circuit impedance measurement is carried out on the secondary side of the transformer T, that is to say on the low-voltage side of the capacitive voltage transformer 50, with a measuring device 90 which is connected to the connection 51 on the secondary side of the transformer T. The short-circuit impedance measurement will be described in detail below.

Figure 3:
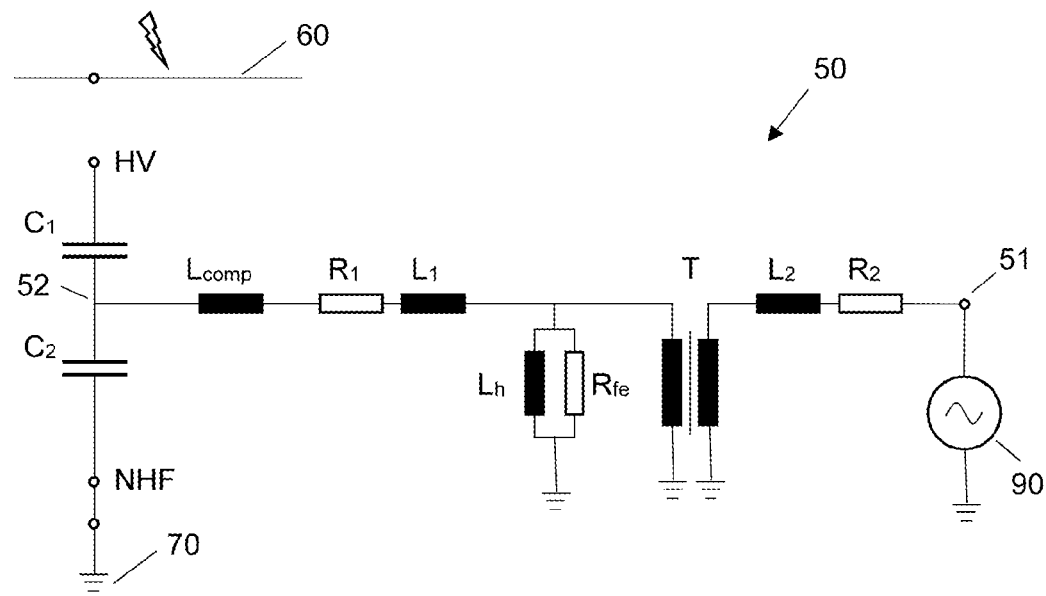
FIG. 3 schematically shows an interconnection of the capacitive voltage transformer of FIG. 1 for determining a second resonant frequency.

In the case of the measurement setup shown in FIG. 3, the high-voltage connection HV is open and the NHF connection is connected to earth 70. Substantially only the second capacitor $C_2$ is then connected between the tap 52 and earth. A short-circuit impedance measurement is carried out on the secondary side of the transformer T with the measuring device 90.

Figure 4:
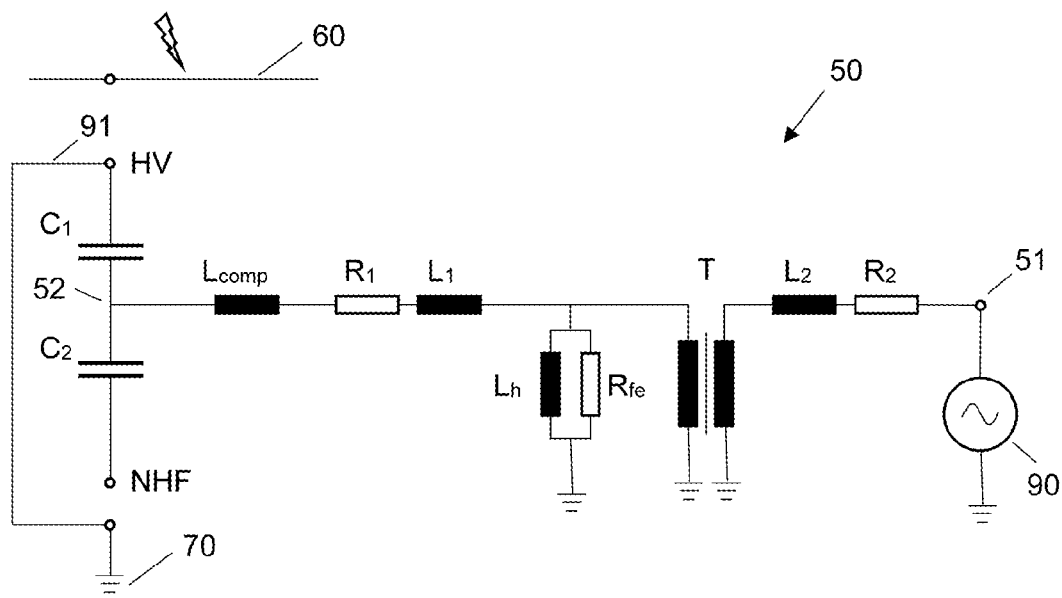
FIG. 4 schematically shows an interconnection of the capacitive voltage transformer of FIG. 1 for determining a further resonant frequency.

FIG. 4 shows a measurement setup, in which the high-voltage connection HV is connected via an additional line 91 to earth and the NHF connection is open, so that substantially only the first capacitor $C_1$ is connected between the tap 52 and earth 70. A short-circuit impedance measurement is carried out on the secondary side of the transformer T with the measuring device 90.

The measurement setups shown in FIGS. 2 to 4 differ in that different capacitive loads act on the primary side of the capacitive voltage transformer during the frequency-dependent short-circuit impedance measurement. In FIG. 2, the capacitors $C_1$ and $C_2$ are both connected to earth, so that the parallel connection of $C_1$ and $C_2$ acts as a capacitive load. In FIG. 3, only the capacitor $C_2$ acts as a capacitive load and, in FIG. 4, only the capacitor $C_1$ acts as a capacitive load.

As will be described below, a capacitance ratio $K_C$ between the capacitance of the capacitor $C_1$ and the capacitance of the capacitor $C_2$ can be determined by way of two different frequency-dependent short-circuit impedance measurements on the secondary side of the capacitive voltage transformer, even without knowing the inductive transformation ratio of the capacitive voltage transformer which is defined via the ratio of the secondary and primary number of turns. The frequency-dependent short-circuit impedance measurements are executed by way of a current signal which has an amplitude which substantially corresponds to a nominal current of the capacitive voltage transformer or is close to this nominal current. During the frequency-dependent short-circuit impedance measurement, the frequency is gradually changed, for example increased in steps from a low starting frequency to a higher end frequency. The current intensity of the current signal, that is to say of a measurement current, can be determined and adjusted, using information from the nameplate of the capacitive voltage transformer. For example, the measurement current can be determined and adjusted based on the burden Sr indicated on the nameplate and the voltage drop at the burden $U_{sr}$. The burden can be indicated as an apparent power in the unit voltamperes (VA) which is formed as the product of the nominal current occurring on the secondary side at the current transformer and the associated voltage drop at the burden.

For example, a resonant frequency can be determined by a plurality of short-circuit impedance measurements at different frequencies. By way of example, the frequency at which a respective short-circuit impedance measurement is carried out can be increased in coarse steps in a first sweep, so that the range of the resonant frequency can be coarsely delimited. In a second sweep, the frequency at which a respective short-circuit impedance measurement is carried out can be increased in more precise steps in the range which has been determined in the first sweep and, consequently, the resonant frequency can be determined more accurately. In other words, a plurality of short-circuit impedance measurements can be carried out in a first frequency grid in the first sweep and a plurality of short-circuit impedance measurements can be carried out in a second frequency grid in the second sweep, which has a smaller frequency distance than the first frequency grid.

The basis of the following considerations is Thomson's formula regarding oscillations (Equation 1), with which the resonant frequency $\omega(=2\pi f)$ of an oscillating circuit can be calculated with a capacitance C and an inductance L. In the following equations, angular frequencies are denoted by w and oscillation numbers are denoted by f. In the text, these quantities w and f are simply referred to as frequencies.

$$\omega^2 = \frac{1}{L*C} \qquad \text{Equation 1}$$

Resonant frequencies can be determined for the oscillating circuit shown in FIGS. 2 to 4. The resonant frequencies can be used in order to determine the capacitance ratio. With the oscillating circuits shown in FIGS. 2 to 4, three resonant frequencies can be determined from corresponding frequency-dependent short-circuit impedance measurements.

For the circuit arrangement according to FIG. 2, a first resonant frequency $\omega_e$ can be determined which depends on the sum of the capacitances of the capacitors $C_1$ and $C_2$ according to Equation 2.

$$\omega_e = \frac{1}{\sqrt{L*(C_1+C_2)}} \rightarrow \omega_e^2 = \frac{1}{L*(C_1+C_2)} \qquad \text{Equation 2}$$

For the circuit arrangement according to FIG. 3, a second resonant frequency $\omega_e$ can be determined, which depends on the capacitance of the capacitor $C_2$ according to Equation 3.

$$\omega_2 = \frac{1}{\sqrt{L*C_2}} \rightarrow \omega_2^2 = \frac{1}{L*C_2} \qquad \text{Equation 3}$$

For the circuit arrangement according to FIG. 4, a further resonant frequency $\omega_1$ can be determined, which depends on the capacitance of the capacitor $C_1$ according to Equation 4.

$$\omega_1 = \frac{1}{\sqrt{L*C_1}} \rightarrow \omega_1^2 = \frac{1}{L*C_1} \quad \text{Equation 4}$$

The capacitance ratio $K_C$ of the capacitive voltage transformer 50 depends on the individual capacitances of the voltage divider and can be defined as the quotient from the sum of the capacitances of the capacitors $C_1$ and $C_2$ and the capacitance of the capacitor $C_1$ (Equation 5); cf. also International Standard IEC 61869-5, Sec. 3.1.528, Note 501.

$$K_c = \frac{C_1 + C_2}{C_1} \quad \text{Equation 5}$$

The equations 2 to 4 derived from the frequency-dependent short-circuit impedance measurements can be utilised in Equation 5. In this way, four further equations (Equation 6 to Equation 9) can be derived. The resonant frequencies $\omega_1$ and $\omega_e$ are included in Equation 6, the resonant frequencies $\omega_1$ and $\omega_2$ are included in Equation 7, the resonant frequencies $\omega_2$ and $\omega_e$ are included in Equation 8 and the resonant frequencies $\omega_1$, $\omega_2$ and $\omega_e$ are included in Equation 9. As described above, the determination of the resonant frequency $\omega_1$ can be problematic since the NHF connection has to be disconnected from earth for this, which is not always (easily) possible. Equation 8, which is independent of the measurement of the resonant frequency $\omega_1$, will therefore be mainly considered below.

$$K_C = \frac{\omega_1^2}{\omega_e^2} \quad \text{Equation 6}$$

$$K_C = \frac{\omega_1^2 + \omega_2^2}{\omega_2^2} \quad \text{Equation 7}$$

$$K_C = \frac{\omega_2^2}{\omega_2^2 - \omega_e^2} \quad \text{Equation 8}$$

$$K_C = \frac{\omega_e^2 * (\omega_2^2 + \omega_1^2)}{\omega_1^2 * (\omega_2^2 - \omega_e^2)} \quad \text{Equation 9}$$

In order to provide the lowest possible measurement voltage proportional to the high voltage with the capacitive voltage divider consisting of the capacitors $C_1$ and $C_2$, a considerably larger capacitance can be selected for the capacitor $C_2$ than for the capacitance of the capacitor $C_1$, i.e., $C_2 >> C_1$. Therefore, the total capacitance $C_1+C_2$ in the circuit arrangement according to FIG. 2 only differs slightly from the capacitance of the capacitor $C_2$. It follows from this that the resonant frequencies $\omega_e$ and $\omega_2$ of the circuit arrangements according to FIG. 2 and according to FIG. 3 only differ slightly from one another. An inductance which forms a corresponding resonant circuit together with the capacitances $C_1$ and/or $C_2$ can have a frequency-dependent non-linearity. However, the inductance which forms a corresponding resonant circuit together with the capacitance $C_2$ or respectively $C_1+C_2$ is therefore substantially the same in the circuit arrangements according to FIG. 2 and FIG. 3. This applies in particular to Equation 8. The operating points of the circuit arrangements according to FIG. 2 and FIG. 3 are virtually identical, since the resonant inductance is substantially the same in both measurements. In particular, this means that the operating points of the non-linear inductance are virtually the same, since the impedance values are close to one another at the resonant frequency of the measurements (with $C_2$ or respectively $C_1+C_2$). Equation 8 is the valid equation for determining the capacitance ratio $K_C$ due to the same operating point.

The resonant inductance L, which can be taken into account in order to consider the capacitances of the capacitors $C_1$ and $C_2$ separately, can be derived from the nameplate. The resonant inductance L can represent the compensation inductance $L_{comp}$, the leakage inductances $L_1$ and $L_2$ as well as the main inductance Ln. For example, the resonant inductance L can be determined with Thomson's formula regarding oscillations according to Equation 10.

$$\omega^2 = \frac{1}{L*C} \rightarrow L = \frac{1}{\omega^2 * (C_1 + C_2)} \quad \text{Equation 10}$$

For example, the resonant inductance L of the capacitive voltage transformer can be determined on the basis of nominal values of the first and second capacitors $C_1$ and $C_2$ and a nominal frequency $\omega$ of the capacitive voltage transformer. However, it should be noted that the absolute values of the inductance, for example the resonant inductance L or the compensation inductance $L_{comp}$, as well as the absolute values of the capacitors $C_1$ and $C_2$ do not necessarily have to be known or be very significant, since they generally have a certain tolerance based on the specification on the nameplate. The percentage difference between the two capacitances ($C_1$ and $C_2$) at different measurements over time, that is to say a temporal trend of the ratio of the capacitances with respect to one another, is more interesting. It is therefore only necessary that the same inductance is used in the equations which have the same operating point. In this case, it is not necessary to know the inductive transformation ratio of the capacitive voltage transformer, i.e., both the capacitance ratio $K_C$ and the resonant inductance L of the capacitive voltage transformer can be determined independently of the inductive transformation ratio using the nominal values indicated above, for example, from the nameplate.

Resonance is achieved in an oscillating circuit when the phase angle between the current and voltage achieves a phase angle of 0°. In the case of a phase angle of 0°, inductive and capacitive imaginary proportions cancel each other out and only the real part remains. The frequency at which this is achieved is referred to as the resonant frequency.

Alternatively or additionally, the resonant inductance L of the capacitive voltage transformer, which is important for the separation of $C_1$ and $C_2$, can be derived from frequency-dependent short-circuit impedance measurements. For example, a plurality of measurements of the short-circuit impedance can be carried out at different frequencies f over a predefined frequency range. The frequency-dependent short-circuit impedance measurements can be carried out on the secondary side of the capacitive voltage transformer while the high-voltage connection HV of the first capacitor $C_1$ is connected to earth, as shown in FIG. 2. Alternatively or additionally, the frequency-dependent short-circuit impedance measurements can be carried out on the secondary side of the capacitive voltage transformer while the high-voltage connection HV of the first capacitor $C_1$ is open, as shown in FIG. 3. These measurements can be interpreted as measurements on a series resonant circuit. A minimal impedance $Z_{sc\_f0}$, a bandwidth B and a resonant frequency $f_0$ can be determined from the measured short-circuit impedances $Z_{sc}$. As shown in Equation 11, the minimal impedance $Z_{sc\_f0}$ is determined by way of the first derivation of the short-circuit impedances $Z_{sc}$ according to the frequency f. The minimal impedance $Z_{sc\_f0}$ is present where the first derivation of the short-circuit impedance produces the value zero or respectively the phase response has the zero-crossing. This point is also referred to as the impedance $Z_{sc\_f0}$ at the resonant frequency $f_0$. This impedance $Z_{sc\_f0}$ corresponds to the ohmic resistance R, since the imaginary parts cancel each other out. The bandwidth B is likewise the product of the frequency-dependent short-circuit impedance measurements. The bandwidth B is defined via the −3 dB points of the current curve. The difference between the resulting upper limiting frequency $f_H$ and lower limiting frequency $f_L$ at −3 dB is defined as the bandwidth B, i.e., the bandwidth B extends over the frequency range from $f_L$ to $f_H$, in which the measured short-circuit current lies a maximum of 3 dB below the maximum short-circuit current. The impedance at the two limiting frequencies $f_L$ and $f_H$ is greater by a factor of square root 2 than the impedance $Z_{sc\_f0}$. The values for the resonant inductance L" and resonant capacitance C" in Equation 12 refer to the secondary side of the transformer T and are transferred to the primary side with the aid of the inductive transformation ratio $K_{IVT}$ of the transformer T, resulting in the resonant inductance L' and the resonant capacitance C' on the primary side of the voltage transformer.

$$\frac{dZ_{sc}}{df} = 0 \rightarrow Z_{sc\_f0} = R \qquad \text{Equation 11}$$

$$B = f_H - f_L; Z_{sc(f_H \text{ und } f_L)} = Z_{sc\_f0} \cdot \sqrt{2}$$

$$L'' = \frac{f_0 \cdot R}{w_0 \cdot B} \rightarrow L' = L'' \cdot K_{IVT}^2 \qquad \text{Equation 12}$$

$$C'' = \frac{1}{w_0^2 * L''} \rightarrow C' = \frac{C''}{K_{IVT}^2}$$

The thus determined resonant inductance L' on the primary side corresponds to the resonant inductance L which can be taken into account in order to separately consider the capacitances of the capacitors $C_1$ and $C_2$ and which represents the compensation inductance $L_{comp}$, the leakage inductances $L_1$ and $L_2$ as well as the main inductance $L_h$ in the respective interconnection according to FIG. 2 or respectively according to FIG. 3.

When carrying out the frequency-dependent short-circuit impedance measurements when the high-voltage connection HV of the first capacitor $C_1$ is interconnected to earth according to FIG. 2, the resonant capacitance C' corresponds to the cumulative capacitance of the first and second capacitors $C_1$ and $C_2$. The resonant frequency $f_0$ or respectively resonant angular frequency $\omega_0$ corresponds to the resonant frequency $\omega_e$ according to Equation 2, taking into account the corresponding resonant inductance L.

When carrying out the frequency-dependent short-circuit impedance measurements with an open high-voltage connection HV of the first capacitor $C_1$ according to FIG. 3, the resonant capacitance C' corresponds to the capacitance of the second capacitor $C_2$. The resonant frequency $f_0$ or respectively resonant angular frequency $\omega_0$ corresponds to the resonant frequency $\omega_2$ according to Equation 3, taking into account the corresponding resonant inductance L.

Figure 5:
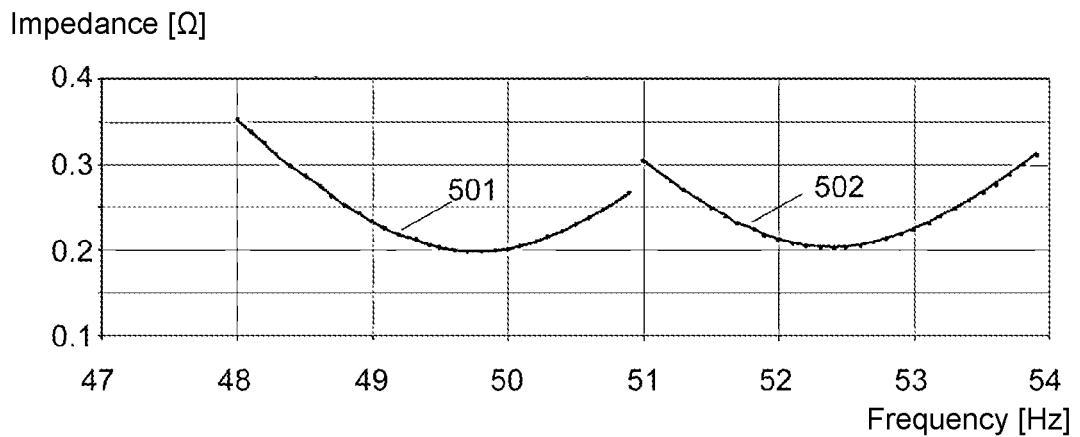
FIG. 5 schematically shows short-circuit impedance measurements at different frequencies for determining the first or respectively second resonant frequency according to one embodiment.
Figure 6:
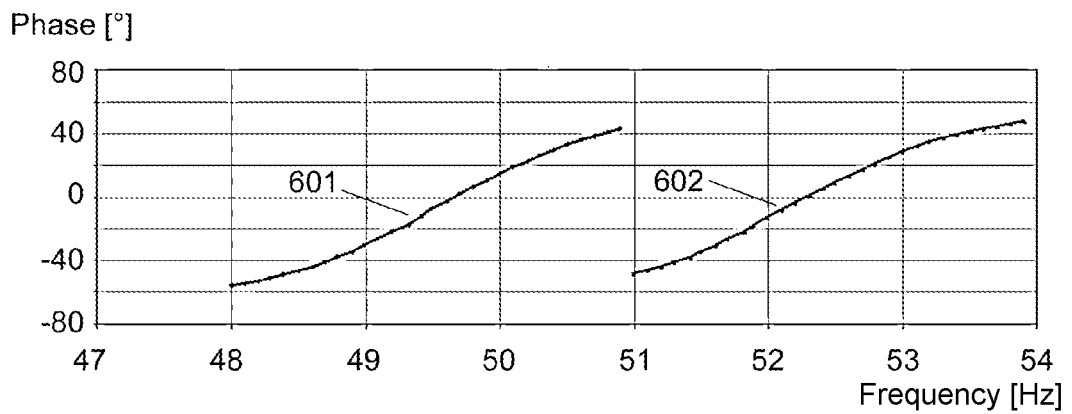
FIG. 6 schematically shows phase angles during short-circuit impedance measurements at different frequencies for determining the first resonant frequency or respectively second resonant frequency according to one embodiment.

FIG. 5 shows measuring results of short-circuit impedance measurements at different frequencies. In detail, FIG. 5 shows impedances 501 of short-circuit impedance measurements on the capacitive voltage transformer according to FIG. 2 at different frequencies and impedances 502 of short-circuit impedance measurements on the capacitive voltage transformer according to FIG. 3 at different frequencies. FIG. 6 shows corresponding phase angles which were measured at different frequencies during the short-circuit impedance measurements. Phase angles 601 were measured on the capacitive voltage transformer during the short-circuit impedance measurements according to FIG. 2 and phase angles 602 were measured on the capacitive voltage transformer during the short-circuit impedance measurements according to FIG. 3. The two measurements show a very similar course of impedance and phase as a function of the frequency. Since the capacitance $C_2$ only differs slightly from the total capacitance $C_1$ plus $C_2$ and the resonant frequency is similar, it can be assumed that the same inductance is responsible for the resonance phenomenon in the circuit arrangements of the voltage transformer according to FIG. 2 and FIG. 3. The resonant frequency of the capacitive voltage transformer in the wiring according to FIG. 2 lies, in this example, between 49 and 50 Hz and the resonant frequency of the capacitive voltage transformer in the wiring according to FIG. 3 lies, in this example, between 52 and 53 Hz.

Figure 7:
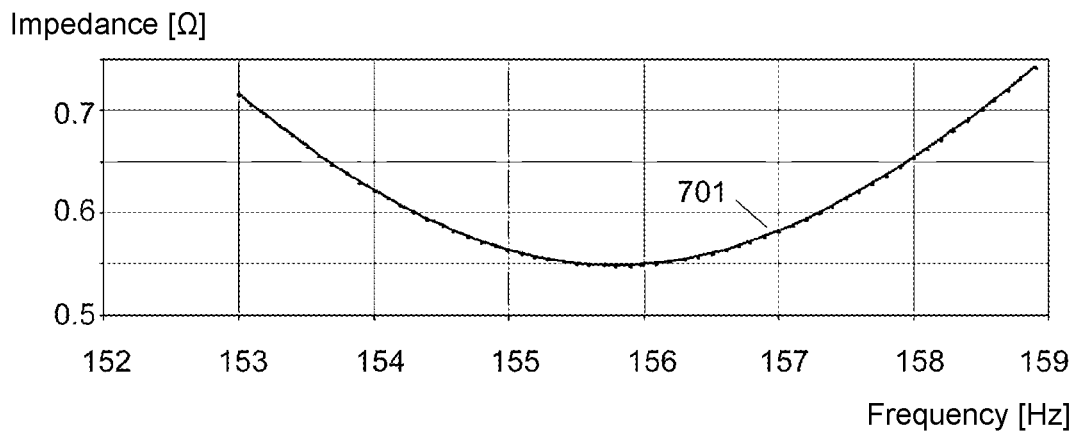
FIG. 7 schematically shows short-circuit impedance measurements at different frequencies for determining the further resonant frequency according to one embodiment.
Figure 8:
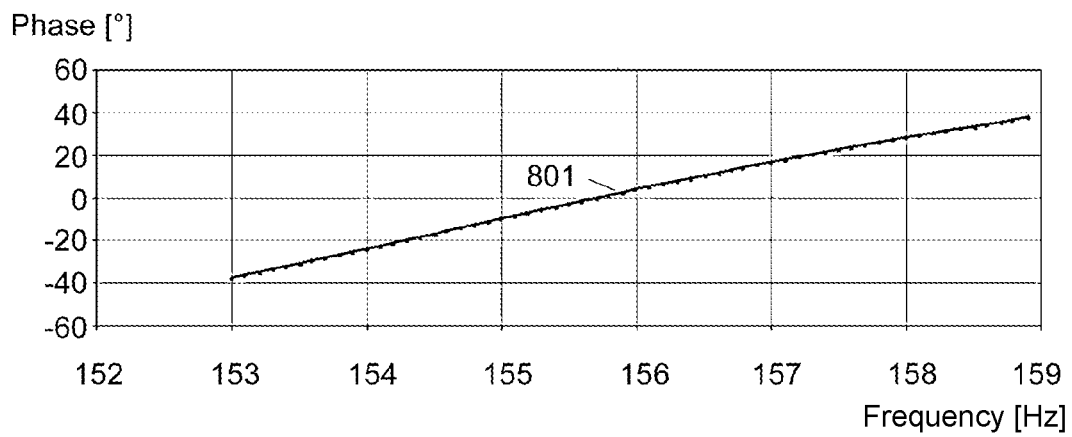
FIG. 8 schematically shows phase angles during short-circuit impedance measurements at different frequencies for determining the further resonant frequency according to one embodiment.

As described above, Equation 8 is in particular suitable for considering the capacitance ratio of the capacitive voltage divider, since the operating points of the circuit arrangements according to FIG. 2 and FIG. 3 are virtually identical, so that the operating points of the non-linear proportions of the inductances are also virtually the same. In contrast to this, the resonant frequency of the wiring of the capacitive voltage transformer according to FIG. 4 lies in a significantly different range, as the measuring results of FIGS. 7 and 8 show. FIG. 7 shows the impedance 701 of short-circuit impedance measurements on the capacitive voltage transformer according to FIG. 4 at different frequencies and FIG. 8 shows corresponding phase angles 801 which were measured at different frequencies during the short-circuit impedance measurements. It is obvious from FIGS. 7 and 8 that the resonant frequency of the capacitive voltage transformer in the wiring according to FIG. 4 lies in the range from 155 to 156 Hz.

The short-circuit impedance measurements on the capacitive voltage transformer according to the wiring arrangements, as shown in FIGS. 2 and 3, are therefore possible, on the one hand, without disconnecting the ground connection at the NHF connection, and can further ensure that the capacitive voltage transformer in both cases is operated at approximately the same operating point, so that a non-linear behaviour of components of the capacitive voltage transformer, for example inductances in the capacitive voltage transformer, can be neglected.

The following considerations are based on at least two resonant frequencies from different measurements, for example short-circuit impedance measurements according to the wiring arrangements as shown in FIGS. 2 and 3. The resonant frequencies can be derived from measuring results of the short-circuit impedance measurements, for example by interpolation. The interpolation can have a certain inaccuracy. In order to counteract this inaccuracy, a plurality of measurements can be carried out around the phase zero-crossing. For example, in a first measurement sweep, a relatively wide frequency range can be scanned in wide frequency steps, for example a frequency range from 20 Hz to 200 Hz in steps of a few Hertz, for example in steps of 0.5 Hz to 5 Hz. As a result, it is possible to ascertain an approximate range in which the resonant frequency is located. The approximate range still only comprises a few Hertz. In a second measurement sweep, this area can be scanned in smaller frequency steps, for example in steps of 0.1 Hz or 0.01 Hz, in order to determine the resonant frequency more accurately.

Using Equation 8, the capacitance ratio can be determined based on the resonant frequencies determined by way of the short-circuit impedance measurements, for example on the basis of the resonant frequencies $\omega_e$ and $\omega_2$ determined for the circuit arrangements according to FIGS. 2 and 3:

$$K_C = \frac{\omega_2^2}{\omega_2^2 - \omega_e^2} \quad \text{Equation 13}$$

The capacitance ratio $K_C$ can lie in a range of 10, for example.

The absolute values of the capacitances of the capacitors $C_1$ and $C_2$ can, for example, be determined based on the capacitance ratio $K_C$. To this end, the total inductance of the capacitive voltage transformer is to initially be determined. To this end, the capacitance values from the nameplate of the voltage transformer can be used. Capacitance values for $C_1$ and $C_2$ can, for example, be indicated on the nameplate of the capacitive voltage transformer. Typical values are, for example, $C_1$=5140 pF (+10%, −5%) and $C_2$=50700 pF (+10%, −5%). The nominal frequency of the capacitive voltage transformer can be further indicated, for example 50 Hz. These values can be utilised in Equation 14 below, from which the inductance of the capacitive voltage transformer can be at least approximately determined. The inductance for the example indicated above is, for example, 180.1586 H.

$$\omega^2 = \frac{1}{L*C} \rightarrow L = \frac{1}{\omega^2 * (C_1 + C_2)} \quad \text{Equation 14}$$

The actual capacitance of the capacitor $C_2$ can then be determined using Equation 15 using the resonant frequency $\omega_2$.

$$C_2 = \frac{1}{L*\omega_2^2} \quad \text{Equation 15}$$

The capacitance of the capacitor $C_1$ can be determined using the capacitance of the capacitor $C_2$ and the capacitance ratio $K_C$ according to Equation 16.

$$C_1 = \frac{C_2}{K_c - 1} \quad \text{Equation 16}$$

The deviations of the thus determined capacitances of the capacitors $C_1$ and $C_2$ from the values indicated on the nameplate can be determined in absolute or relative terms and displayed on a display apparatus of the measuring device 90 in order to assess the state of the capacitive voltage divider. Reliable operation of the capacitive voltage transformer can be assumed, for example, if the capacitances of the capacitors $C_1$ and $C_2$ which are actually determined lie within the tolerance ranges indicated on the nameplate.

Furthermore, a dependency of the capacitance ratio on the resonant frequency $\omega_e$ or on the resonant frequency $\omega_2$ can be determined and can be displayed for an assessment of the state of the capacitors of the capacitive voltage divider. By partially differentiating Equation 8 according to the resonant frequency $\omega_2$, the dependency of the capacitance ratio $K_C$ on the resonant frequency $\omega_2$ can be determined according to Equation 17.

$$\frac{\delta K_C}{\delta \omega_2} = -\frac{2*\omega_2*\omega_e^2}{(\omega_2^2 - \omega_e^2)^2} \quad \text{Equation 17}$$

Equally, the dependency of the capacitance ratio $K_C$ on the resonant frequency $\omega_e$ can be determined according to Equation 18 by partially differentiating Equation 8 according to the resonant frequency $\omega_e$.

$$\frac{\delta K_C}{\delta \omega_e} = \frac{2*\omega_2^2*\omega_e}{(\omega_2^2 - \omega_e^2)^2} \quad \text{Equation 18}$$

Figure 9:
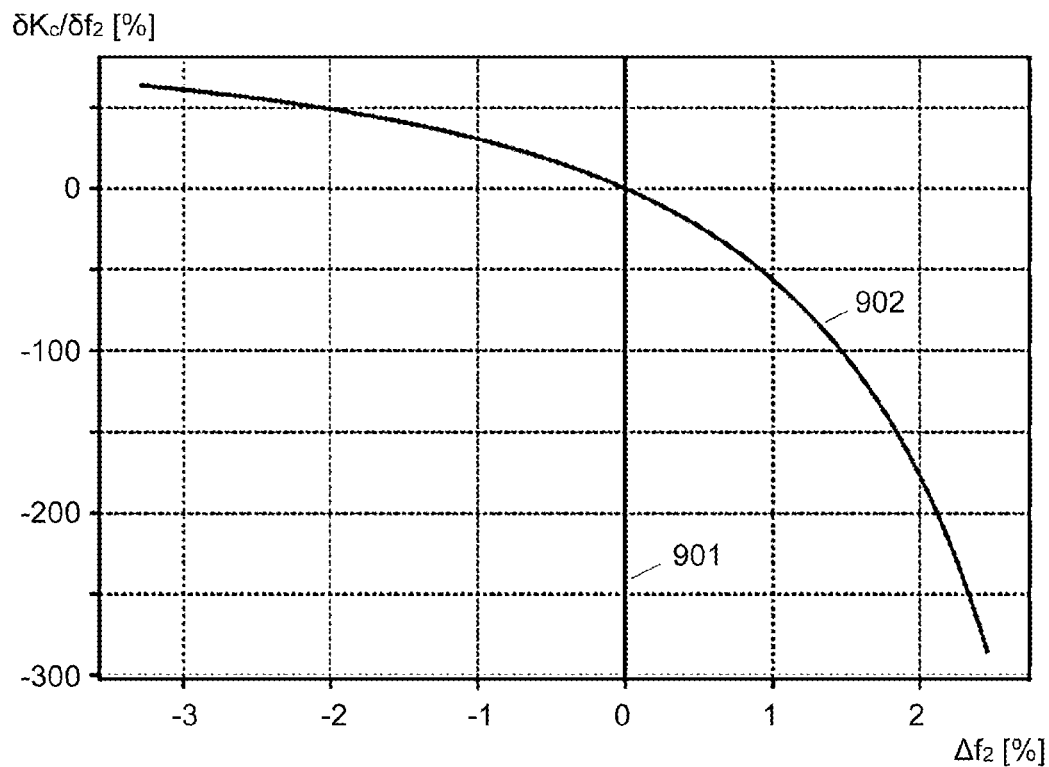
FIG. 9 schematically shows a dependency of a capacitance ratio on the second resonant frequency according to one embodiment.
Figure 10:
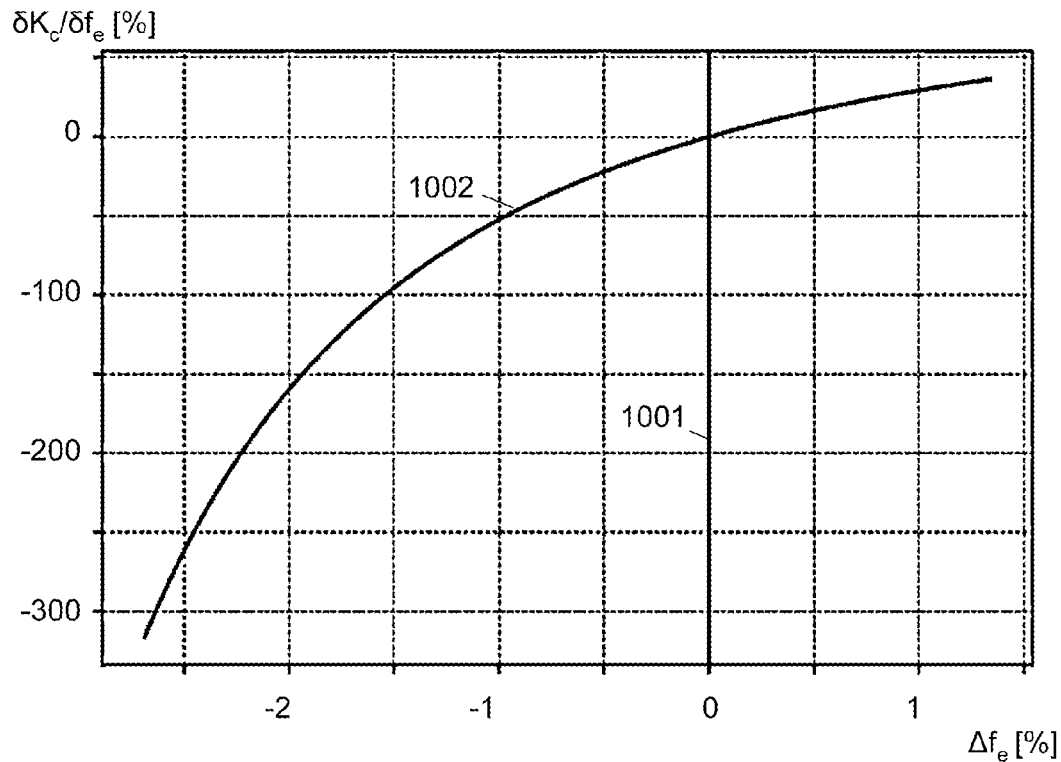
FIG. 10 schematically shows a dependency of a capacitance ratio on the first resonant frequency according to one embodiment.

Consequently, the dependency of the capacitance ratio on the resonant frequency $\omega_e$ or respectively $\omega_2$ relates to a dependency of the change in the capacitance ratio based on a change in the resonant frequency $\omega_e$ or respectively $\omega_2$. This dependency is also referred to as the sensitivity. A high sensitivity can help to make it possible to clearly detect even small changes and, consequently, a deterioration in the state of the capacitive voltage divider can be detected early and reliably. FIG. 9 shows the sensitivity of the capacitance ratio $K_C$ based on a change in the resonant frequency $\omega_2$, wherein the representation was normalised to the measured resonant frequency, that is, the measured resonant frequency is represented by line 901 and the sensitivity of the capacitance ratio is represented by graph 902 in percent on the basis of the change in resonant frequency in percent. FIG. 10 shows the sensitivity of the capacitance ratio $K_C$ based on a change in the resonant frequency $\omega_e$. This representation was also normalised to the measured resonant frequency, that is, the measured resonant frequency is represented by line 1001 and the sensitivity of the capacitance ratio is represented by graph 1002 in percent on the basis of the change in resonant frequency in percent.

Based on Equation 5, the dependency or respectively sensitivity of the capacitance ratio $K_C$ on the capacitance of the capacitor $C_2$ can be represented according to Equation 19. It is obvious from Equation 19 that the sensitivity of the capacitance ratio $K_C$ is constant even if the capacitance of the capacitor $C_2$ changes.

$$\frac{\delta K_C}{\delta C_2} = \frac{1}{C_1} \quad \text{Equation 19}$$

Equally, based on Equation 5, the dependency or sensitivity of the capacitance ratio $K_C$ on the capacitance of the capacitor $C_1$ can be represented according to Equation 20.

$$\frac{\delta K_C}{\delta C_1} = -\frac{C_2}{C_1^2} \quad \text{Equation 20}$$

Figure 11:
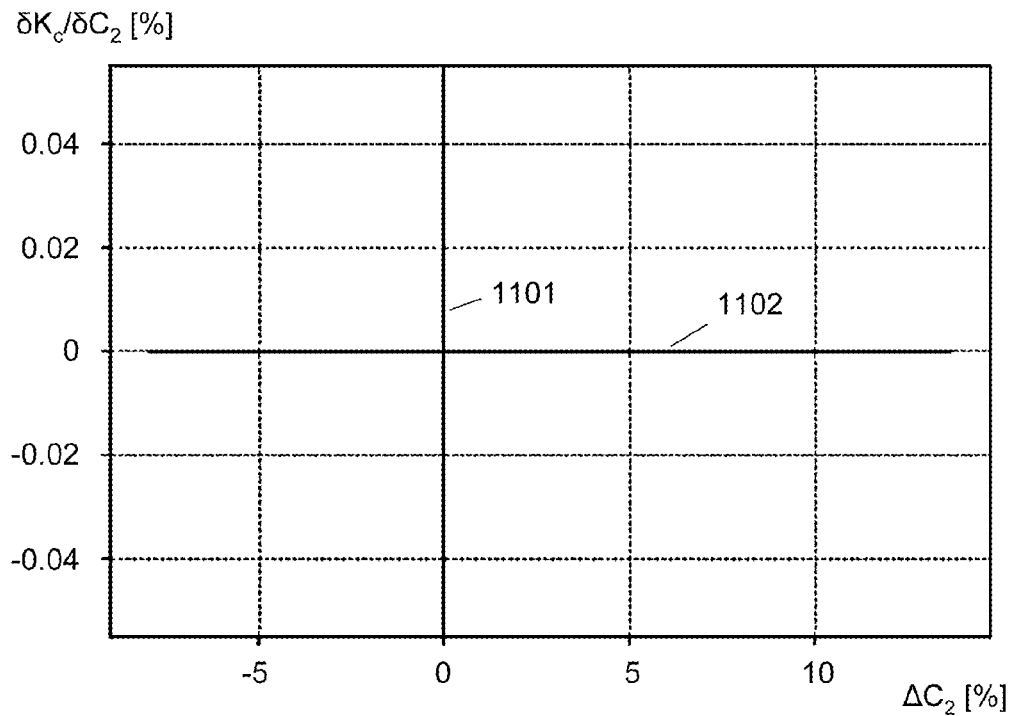
FIG. 11 schematically shows a dependency of a capacitance ratio on a capacitance of a second capacitor of a capacitive voltage divider according to one embodiment.
Figure 12:
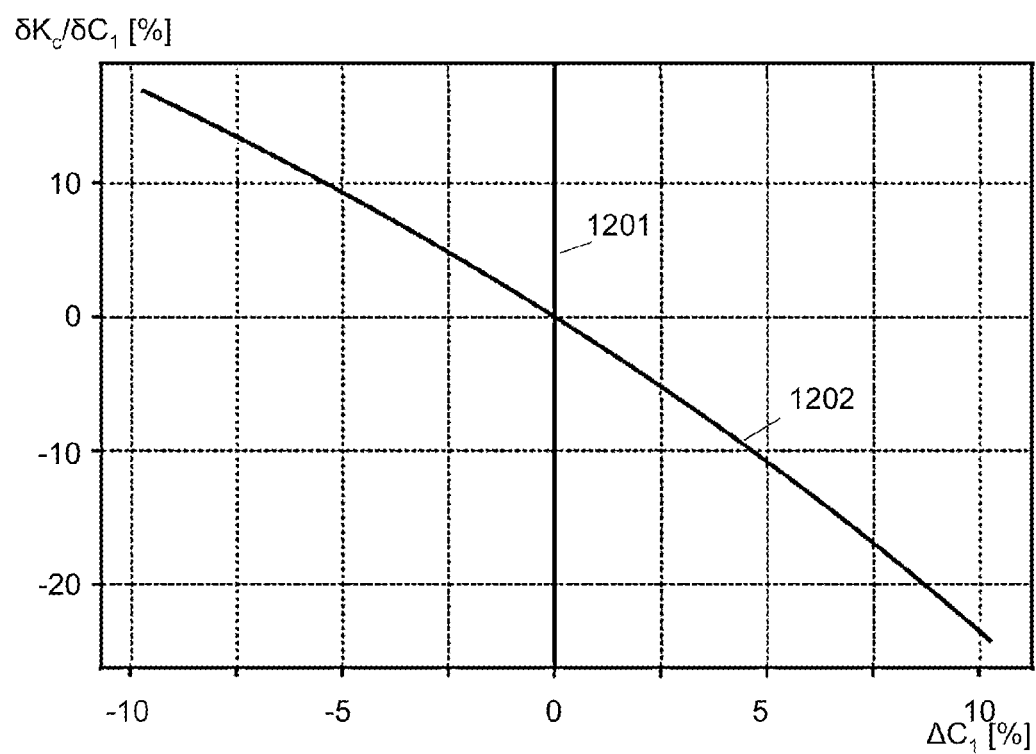
FIG. 12 schematically shows a dependency of a capacitance ratio on a capacitance of a first capacitor of a capacitive voltage divider according to one embodiment.

FIG. 11 shows the sensitivity of the capacitance ratio $K_C$ based on a change in the capacitance of the capacitor $C_2$. The representation was normalised to the measured resonant frequency, that is, the measured resonant frequency is represented by line 1101 and the sensitivity of the capacitance ratio is represented by graph 1102 in percent on the basis of the change in the capacitance of the capacitor $C_2$ in percent. FIG. 12 accordingly shows the sensitivity of the capacitance ratio $K_C$ based on a change in the capacitance of the capacitor $C_2$, wherein the representation was normalised to the measured resonant frequency. The measured resonant frequency is represented by line 1201 and the sensitivity of the capacitance ratio is represented by graph 1202 in percent on the basis of the change in capacitance of the capacitor $C_1$ in percent.

The method determined above can be automatically carried out by the measuring device 90. The mode of operation of the measuring device 90 is summarised below with reference to FIGS. 13 to 15.

Figure 13:
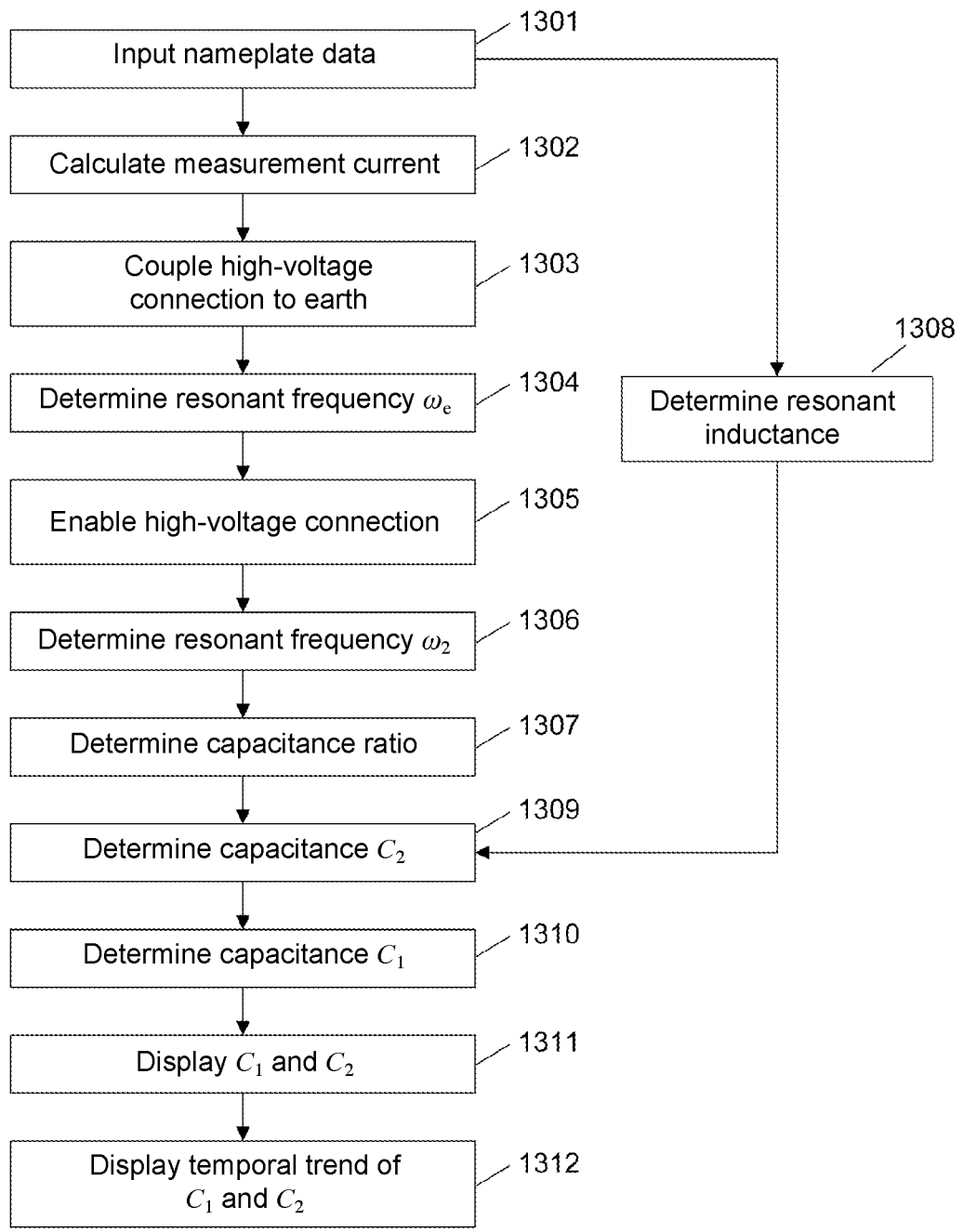
FIG. 13 shows method steps for determining a state of a capacitive voltage transformer according to one embodiment.

The method shown in FIG. 13 comprises method steps 1301 to 1312. In step 1301, data from the nameplate of the capacitive voltage transformer are input, for example via a user interface by an operator of the measuring device 90 or with a corresponding scanner which scans the nameplate of the capacitive voltage transformer to be tested. The data from the nameplate can, for example, comprise the burden and the voltage drop at the burden at nominal frequency as well as nominal values of the first and second capacitors. Although the short-circuit impedance measurements described below are carried out on a secondary side of a transformer of the capacitive voltage transformer, knowledge of an inductive transformation ratio of the transformer is not required in the case of this method. By means of the data from the nameplate, a measurement current is calculated in step 1302, for example as described above, using the burden and the voltage drop at the burden at nominal frequency. In step 1303, the high-voltage connection HV is decoupled from the high-voltage line 60 and coupled to earth 70, so that the wiring according to FIG. 2 is present. In step 1304, the resonant frequency $\omega_e$ is determined, for example by way of a plurality of short-circuit impedance measurements in a first frequency grid followed by a plurality of short-circuit impedance measurements in a second frequency grid, wherein the first frequency grid has a greater frequency distance than the second frequency grid. In step 1305, the high-voltage connection HV is enabled, so that the wiring according to FIG. 3 is present. In step 1306, the resonant frequency $\omega_2$ is determined by way of short-circuit impedance measurements. To this end, a plurality of short-circuit impedance measurements can, in turn, be carried out in a first frequency grid followed by a plurality of short-circuit impedance measurements in a second frequency grid, wherein the first frequency grid has a greater frequency distance than the second frequency grid. In step 1307, a capacitance ratio $K_C$ is determined, for example according to Equation 8. In step 1308, the resonant inductance L is determined from the data from the nameplate, as described above with reference to Equations 10 and 14. In step 1309, taking into account the resonant inductance L, the capacitance of capacitor $C_2$ can be determined according to Equation 15 and, in step 1310, the capacitance of capacitor $C_1$ can be determined according to Equation 16. In step 1311, the capacitance values of capacitors $C_1$ and $C_2$ are displayed, for example, on a display apparatus of the measuring device 90. Moreover, in step 1312, a temporal trend of the capacitances of the capacitors $C_1$ and $C_2$ can be displayed on the display apparatus or, for example, plotted and evaluated over a longer period of time in a processing apparatus. For a trend analysis, the capacitances of the capacitors $C_1$ and $C_2$ can be captured over a longer period of time and, for example, transferred to cloud storage.

Figure 14:
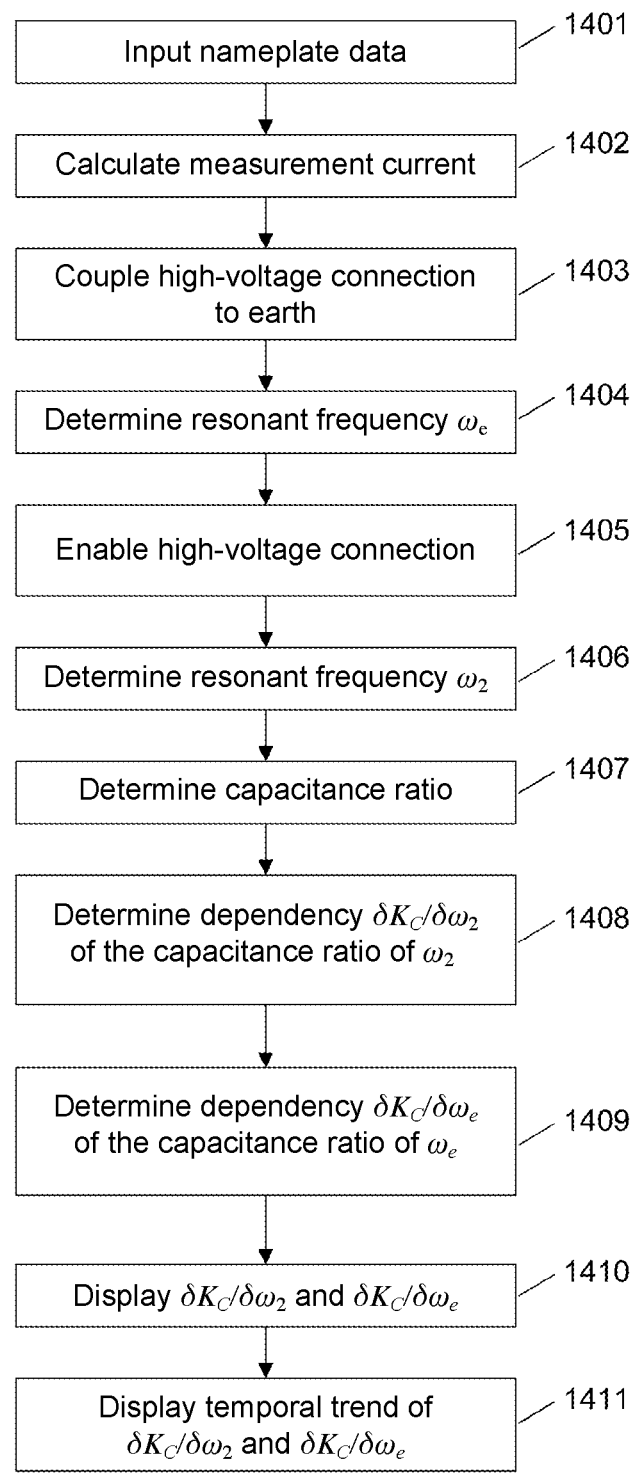
FIG. 14 shows method steps for determining a state of a capacitive voltage transformer according to a further embodiment.

The method shown in FIG. 14 comprises method steps 1401 to 1411. In step 1401, data from the nameplate of the capacitive voltage transformer are input. Said data can be input via a user interface, for example, by an operator of the measuring device 90. Alternatively, said data can be captured electronically from the nameplate of the capacitive voltage transformer to be tested, for example by way of a scanner or a camera. The data from the nameplate can, for example, comprise the burden and the voltage drop at the burden at nominal frequency. Although the short-circuit impedance measurements described below are carried out on a secondary side of a transformer of the capacitive voltage transformer, knowledge of an inductive transformation ratio of the transformer is not required in the case of this method. A suitable measurement current can be calculated in step 1402 by means of the data from the nameplate (cf. step 1302). In step 1403, the high-voltage connection HV is decoupled from the high-voltage line 60 and coupled to earth 70. Consequently, the wiring of the capacitive voltage transformer according to FIG. 2 is present. The resonant frequency $\omega_e$ is next determined in step 1404, for example as described above, using two sweeps of a plurality of short-circuit impedance measurements in each case in different frequency grids. In step 1405, the high-voltage connection HV is enabled, so that the wiring of the capacitive voltage transformer according to FIG. 3 is present. In step 1406, the resonant frequency $\omega_2$ is determined, for example likewise as described above using two sweeps of a plurality of short-circuit impedance measurements in each case with different frequency grids. In step 1407, a capacitance ratio $K_C$ is determined, for example, according to Equation 8. In step 1408, a dependency or sensitivity of the capacitance ratio is determined based on the resonant frequency $\omega_2$ (see also Equation 17). In step 1409, a dependency or sensitivity of the capacitance ratio is determined based on the resonant frequency $\omega_e$ (see also Equation 18). The sensitivities of the capacitance ratio based on the resonant frequency $\omega_2$ or respectively $\omega_e$ are displayed, in step 1410, on a display apparatus of the measuring device 90. In addition, in step 1411, temporal trends of the sensitivities of the capacitance ratio based on the resonant frequency $\omega_2$ or respectively $\omega_e$ can be displayed or stored over time, in order to be evaluated by a processing apparatus. For a trend analysis, the sensitivities can be captured over a longer period of time and transferred, for example, to cloud storage.

Figure 15:
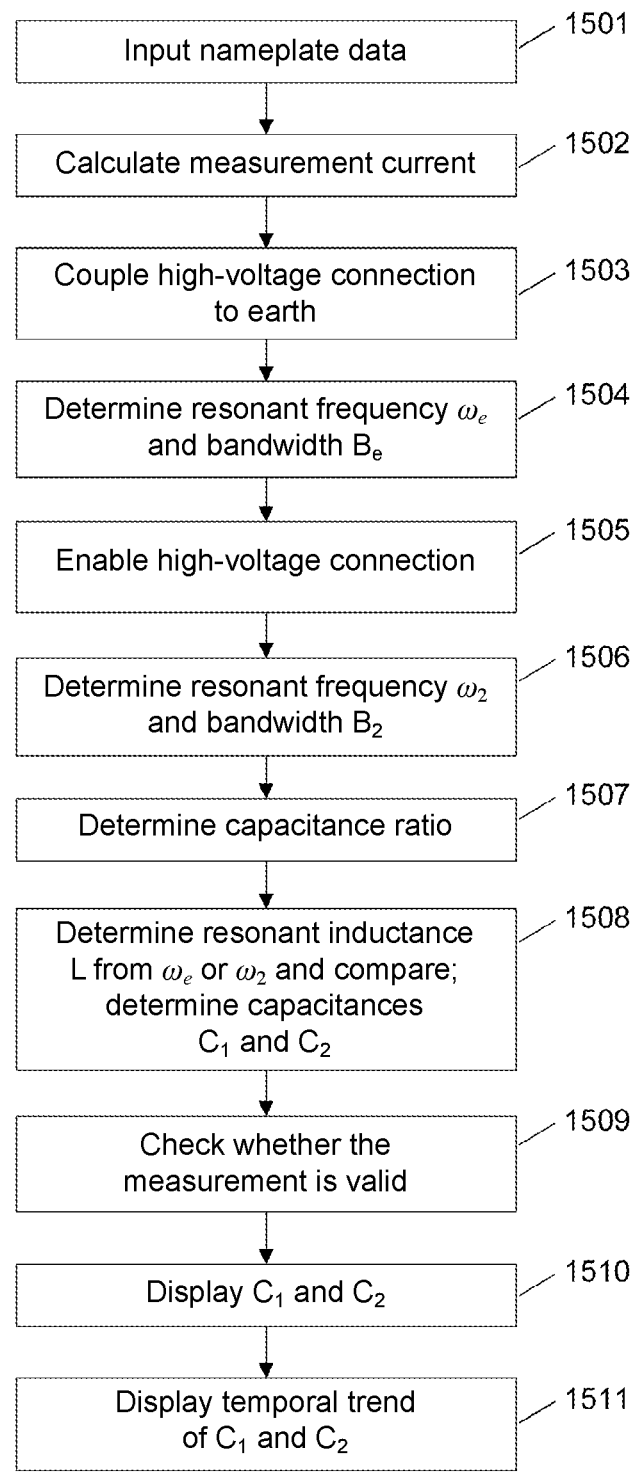
FIG. 15 shows method steps for determining a state of a capacitive voltage transformer according to yet another embodiment.

The method shown in FIG. 15 comprises method steps 1501 to 1511. In step 1501, data from the nameplate of the capacitive voltage transformer are input. Said data can be input via a user interface, for example, by an operator of the measuring device 90. Alternatively, said data can be captured electronically from the nameplate of the capacitive voltage transformer to be tested, for example by way of a scanner or a camera. The data from the nameplate can comprise, for example, the burden and the voltage drop at the burden at nominal frequency as well as an inductive transformation ratio of a transformer of the capacitive voltage transformer. A suitable measurement current can be calculated in step 1502 by means of the data from the nameplate (cf. step 1302). In step 1503, the high-voltage connection HV is decoupled from the high-voltage line 60 and coupled to earth 70. The wiring of the capacitive voltage transformer according to FIG. 2 is consequently present. In step 1504, the resonant frequency $\omega_e$ and bandwidth Be are determined next (see also Equation 11), for example as described above, using two sweeps of a plurality of short-circuit impedance measurements in each case in different frequency grids. In step 1505, the high-voltage connection HV is enabled, so that the wiring of the capacitive voltage transformer according to FIG. 3 is present. In step 1506, the resonant frequency $\omega_2$ and bandwidth $B_2$ are determined (see also Equation 11), for example likewise as described above, using two sweeps of a plurality of short-circuit impedance measurements in each case with different frequency grids. In step 1507, a capacitance ratio $K_C$ is determined from the resonant frequencies $\omega_e$ and $\omega_2$, for example, according to Equation 8. In step 1508, a respective resonant inductance L is determined from the resonant frequency $\omega_e$ or respectively $\omega_2$ (see also Equation 12). The cumulative capacitance of the capacitors $C_1$ and $C_2$ or respectively the capacitance of the capacitor $C_2$ can further be determined according to Equation 12, in step 1508, using the respective resonant inductance L, the respective resonant frequency $\omega_e$ or respectively $\omega_2$ and the inductive transformation ratio. The capacitance of the capacitor $C_1$ can, in turn, be determined therefrom. In step 1509, it can be checked whether the measurement is valid by matching the capacitance ratio $K_C$ determined in step 1507 with the capacitance ratio of the capacitances of the capacitors $C_1$ and $C_2$ determined in step 1508. If the measurement is valid, the capacitance values of the capacitors $C_1$ and $C_2$ can be displayed on a display apparatus of the measuring device 90, for example, in step 1510. Moreover, in step 1511, a temporal trend of the capacitances of the capacitors $C_1$ and $C_2$ can be displayed on the display apparatus or, for example, plotted and evaluated over a longer period of time in a processing apparatus. For a trend analysis, the capacitances of the capacitors $C_1$ and $C_2$ can be captured over a longer period of time and transferred, for example, to cloud storage.

In summary, the methods described above provide a possibility of determining and observing a trend of the two capacitances of a capacitive voltage divider in a capacitive voltage transformer in order to assess a state of the capacitive voltage transformer. The trend provides information about the temporal trend of the capacitances of the capacitors $C_1$ and $C_2$ in the capacitive voltage divider. For a trend analysis of the capacitances, a temporal change over time is more meaningful than the absolute value of the capacitances. The process of using the capacitance values from the nameplate in order to determine the inductance L of the capacitive voltage transformer is therefore justified, since the absolute accuracy of the capacitance values of the capacitors $C_1$ and $C_2$ is not crucial for the trend of the two capacitances. Based on the thus obtained inductance L and the resonant frequencies $\omega_e$ and $\omega_2$ determined by way of short-circuit impedance measurements, the capacitances of the capacitors $C_1$ and $C_2$ can be calculated and used as reference values. These values provide a reliable basis for status monitoring by way of a trend.

What is claimed is:

1. A method for determining a state of a capacitive voltage transformer, wherein the capacitive voltage transformer comprises, on a primary side of the capacitive voltage transformer, a capacitive voltage divider having a first capacitor and a second capacitor, wherein the first capacitor has a high-voltage connection for connection to a high voltage and the second capacitor has a ground connection, wherein the method comprises:
   determining a first resonant frequency by way of a plurality of first short-circuit impedance measurements at different frequencies on a secondary side of the capacitive voltage transformer while the high-voltage connection is connected to earth,
   determining a second resonant frequency by way of a plurality of second short-circuit impedance measurements at different frequencies on the secondary side of the capacitive voltage transformer while the high-voltage connection is open, and
   determining a capacitance ratio of the capacitive voltage divider on the basis of the first resonant frequency and the second resonant frequency.

2. The method according to claim 1, further comprising:
   determining a measurement current on the basis of a burden of the capacitive voltage transformer and a voltage drop at the burden of the capacitive voltage transformer, wherein the plurality of first short-circuit impedance measurements and the plurality of second short-circuit impedance measurements are carried out using the measurement current.

3. The method according to claim 1,
   wherein the plurality of first short-circuit impedance measurements comprises a plurality of short-circuit impedance measurements in a first frequency grid followed by a plurality of short-circuit impedance measurements in a second frequency grid, wherein the first frequency grid has a greater frequency distance than the second frequency grid, and/or
   wherein the plurality of second short-circuit impedance measurements comprises a plurality of short-circuit impedance measurements in a first frequency grid followed by a plurality of short-circuit impedance measurements in a second frequency grid, wherein the first frequency grid has a greater frequency distance than the second frequency grid.

4. The method according to claim 1, further comprising:
   determining a resonant inductance of the capacitive voltage transformer on the basis of nominal values of the first and second capacitors and a nominal frequency of the capacitive voltage transformer, and
   determining an actual value of the capacitance of the second capacitor on the basis of the second resonant frequency and the resonant inductance.

5. The method according to claim 4, wherein the resonant inductance is determined independently of an inductive transformation ratio of a transformer of the capacitive voltage transformer.

6. The method according to claim 4, further comprising:
   determining a plurality of actual values of the capacitance of the second capacitor at different points in time, and
   representing a temporal trend of the capacitance of the second capacitor on a display apparatus.

7. The method according to claim 4, further comprising:
   determining an actual value of the capacitance of the first capacitor on the basis of the actual value of the capacitance of the second capacitor and the capacitance ratio.

8. The method according to claim 1, further comprising:
   determining a first minimal impedance and a first bandwidth by way of the plurality of first short-circuit impedance measurements at different frequencies on the secondary side of the capacitive voltage transformer while the high-voltage connection is connected to earth,
   determining a second minimal impedance and a second bandwidth by way of the plurality of second short-circuit impedance measurements at different frequencies on the secondary side of the capacitive voltage transformer while the high-voltage connection is open, and determining an actual value of the capacitance of the first capacitor $C_1$ and an actual value of the capacitance of the second capacitor $C_2$ on the basis of the first minimal impedance, the first bandwidth, the second minimal impedance of the second bandwidth and an inductive transformation ratio of a transformer of the capacitive voltage transformer.

9. The method according to claim 8, further comprising:
comparing the capacitance ratio, which is determined on the basis of the first resonant frequency and the second resonant frequency, with a capacitance ratio, which is determined on the basis of the actual value of the capacitance of the first capacitor $C_1$ and the actual value of the capacitance of the second capacitor $C_2$, and
determining a validity of the determining of the actual value of the capacitance of the first capacitor $C_1$ and the actual value of the capacitance of the second capacitor $C_2$ on the basis of the comparison.

10. The method according to claim 8, further comprising:
determining a plurality of actual values of the capacitance of the second capacitor at different points in time, and
representing a temporal trend of the capacitance of the second capacitor on a display apparatus.

11. The method according to claim 8, further comprising:
determining a plurality of actual values of the capacitance of the first capacitor at different points in time, and
representing a temporal trend of the capacitance of the first capacitor on a display apparatus.

12. The method according to claim 1, further comprising:
determining a plurality of capacitance ratios of the capacitive voltage divider at different points in time, and
representing a temporal trend of the capacitance ratio on a display apparatus.

13. The method according to claim 1, further comprising:
determining a first dependency of the capacitance ratio on the first resonant frequency.

14. The method according to claim 13, further comprising:
determining a plurality of first dependencies of the capacitance ratio on the first resonant frequency at different points in time, and
representing a temporal trend of the first dependency on a display apparatus.

15. The method according to claim 1, further comprising:
determining a second dependency of the capacitance ratio on the second resonant frequency.

16. The method according to claim 15, further comprising:
determining a plurality of second dependencies of the capacitance ratio on the second resonant frequency at different points in time, and
representing a temporal trend of the second dependency on a display apparatus.

17. An apparatus for determining a state of a capacitive voltage transformer, wherein the capacitive voltage transformer comprises, on a primary side of the capacitive voltage transformer, a capacitive voltage divider having a first capacitor and a second capacitor, wherein the first capacitor has a high-voltage connection for connection to a high voltage and the second capacitor has a ground connection, wherein the apparatus comprises:
a measuring apparatus which is configured to carry out a short-circuit impedance measurement with an adjustable frequency, and
a control apparatus which is configured
to determine a first resonant frequency by way of a plurality of first short-circuit impedance measurements at different frequencies on a secondary side of the capacitive voltage transformer while the high-voltage connection is connected to earth,
to determine a second resonant frequency by way of a plurality of second short-circuit impedance measurements at different frequencies on the secondary side of the capacitive voltage transformer while the high-voltage connection is open, and
to determine a capacitance ratio of the capacitive voltage divider on the basis of the first resonant frequency and the second resonant frequency.

* * * * *